United States Patent
Onuma (10) Patent No.: US 6,376,357 B1
(45) Date of Patent: Apr. 23, 2002

(54) METHOD FOR MANUFACTURING A SEMICONDUCTOR DEVICE WITH VOIDS IN THE INSULATION FILM BETWEEN WIRINGS

(75) Inventor: Takuji Onuma, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/084,914

(22) Filed: May 28, 1998

(30) Foreign Application Priority Data

May 30, 1997 (JP) ............................................. 9-157854

(51) Int. Cl.$^7$ ......................................... H01L 21/4763
(52) U.S. Cl. ...................... 438/619; 438/629; 438/626; 438/700; 438/723
(58) Field of Search ................................ 438/619, 626, 438/624, 675, 421, 422, 618, 637, 787, 620, 723, 700

(56) References Cited

U.S. PATENT DOCUMENTS

| 5,512,514 A | * | 4/1996 | Lee | 438/626 |
| 5,792,706 A | * | 8/1998 | Michael et al. | 438/626 |
| 5,814,558 A | * | 9/1998 | Jeng et al. | 438/623 |
| 6,013,575 A | * | 1/2000 | Itoh | 438/641 |
| 6,107,183 A | * | 8/2000 | Sandhu et al. | 438/622 |

FOREIGN PATENT DOCUMENTS

| JP | 62-5643 | 1/1987 |
| JP | 2-86146 | 3/1990 |
| JP | 2-240947 | 9/1990 |
| JP | 4-207055 | 7/1992 |
| JP | 5-21617 | 1/1993 |

* cited by examiner

Primary Examiner—Trung Dang
Assistant Examiner—Kurt Eaton
(74) Attorney, Agent, or Firm—Foley & Lardner (57) ABSTRACT

An interlayer insulation film has a void that minimally has a height that extends from a position that is above the upper surface of wiring to a position that is below the lower surface of wiring, the side wall of this void being linear at an angle in the range from 80 to 100 degrees with respect to the substrate.

1 Claim, 6 Drawing Sheets

METHOD FOR MANUFACTURING A SEMICONDUCTOR DEVICE WITH VOIDS IN THE INSULATION FILM BETWEEN WIRINGS

BACKGROUND OF THE INVENTION

1. Field of the Invention

The present invention relates to a semiconductor device and to a method of manufacturing the semiconductor device, and more specifically to a semiconductor device having an insulation film between wiring and a method of manufacturing this type of semiconductor device.

2. Description of Related Art

Recently, along with the shrinking of the design rule for semiconductor devices, the spacing between wiring has become more and more narrow, to the extent that the capacitance between adjacent wirings has become a large problem.

Because of this, there is a desire to achieve a low dielectric constant in interlayer insulation films, and one method of achieving this low dielectric constant that has been proposed is that of forming a void in an insulation film previously used, in order to reduce the dielectric constant.

Figure 5:
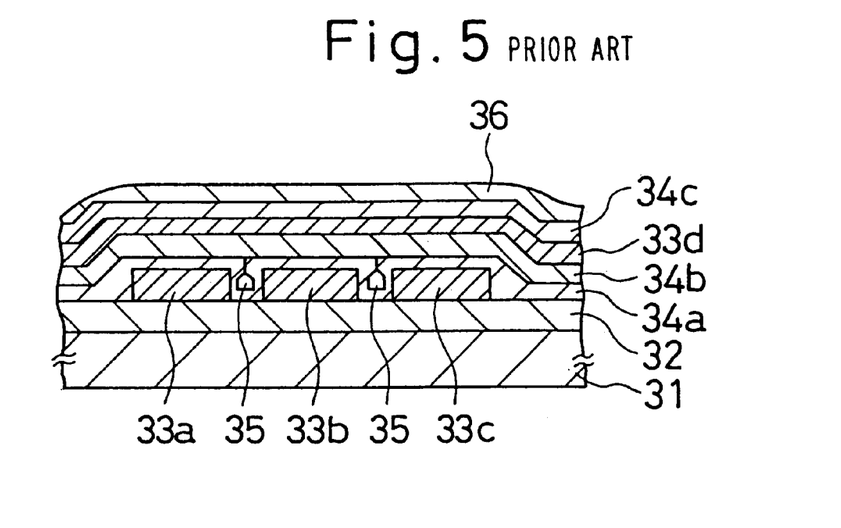
FIG. 5 is a cross-sectional view which illustrates the first prior art as disclosed in the Japanese Unexamined Patent Publication No. H2-86146.

For example, in the Japanese Unexamined Patent Publication No. 2-86146, as shown in the cross-sectional view of FIG. 5, there is a proposal of a method of using the shape of the overhang at the end of a wiring when growing the insulation film 34a to make a void 35 between the wirings (33a, 33b, and 33c).

Figure 6:
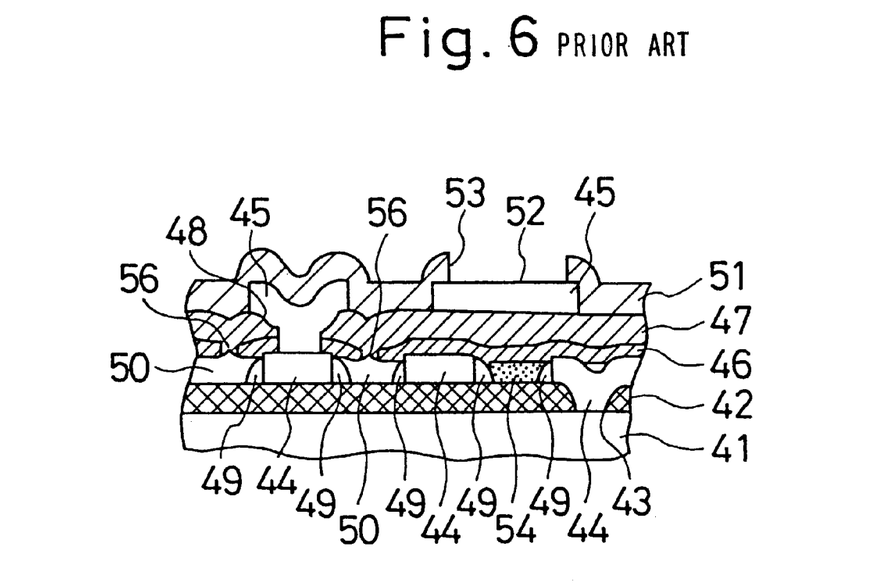
FIG. 6 is a cross-sectional view which illustrates the second prior art as disclosed in the Japanese Unexamined Patent Publication No. H4-207055.

In the Japanese Unexamined Patent Publication No. 4-207055, as shown in the cross-sectional view of FIG. 6, there is a proposal of a method of burying an insulation film 54 which can be selectively etched between the wirings 44, and then performing isotropic etching from an aperture 56 to selectively etch the buried insulation film 54, thereby forming a void 50.

Figure 7A:
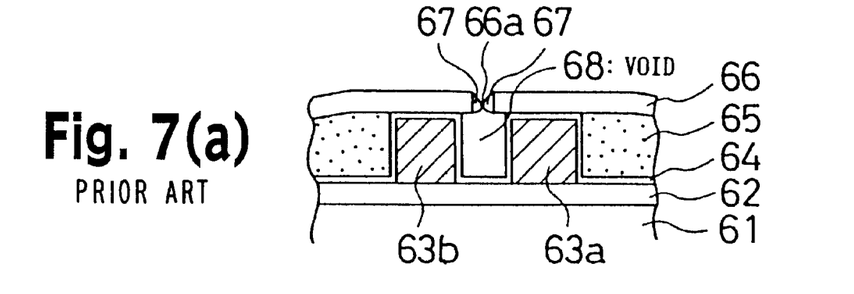
FIGS. 7(a)–7(d) are cross-sectional views which illustrate the third prior art as disclosed in the Japanese Unexamined Patent Publication No. H5-21617.
Figure 7B:
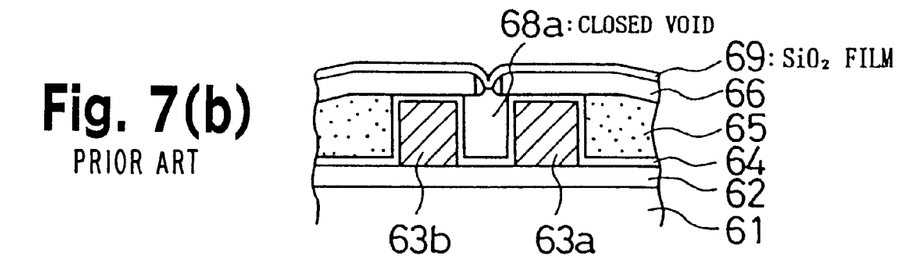
Figure 7C:
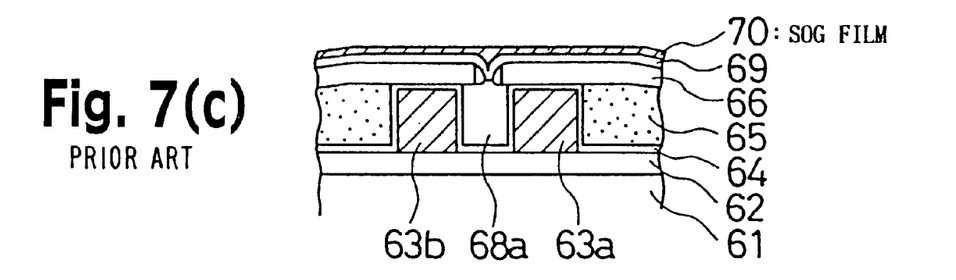

As the same type of technology, there is the example of the Japanese Unexamined Patent Publication No. 5-21617 in which, as shown in the process cross-sectional views of FIG. 7(e) through FIG. 7(g), there is a proposal of a method of selectively removing an insulation film 65, which is buried between the wirings 63a and 63b, starting at the small aperture 66a, so as to form the void 68a, thereby reducing the capacitance between the wirings.

Figure 7D:
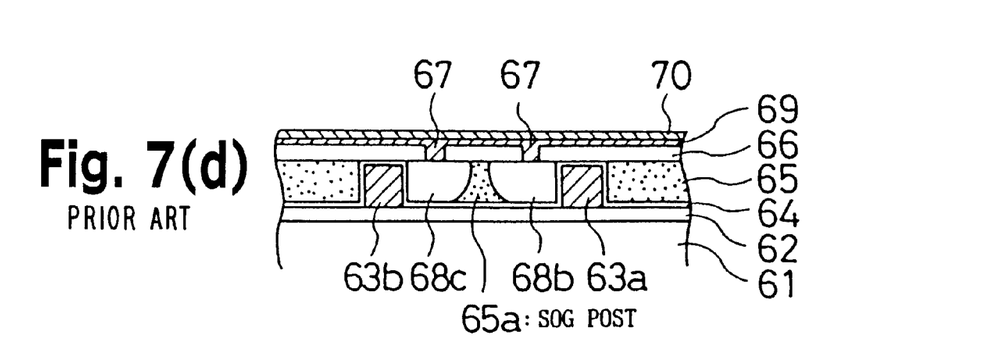

FIG. 7(h) shows the configuration of another embodiment that is presented in the above-noted Japanese Unexamined Patent Publication No. 5-21617.

The above-noted prior art, however, has the following problems.

(1) In the method in the past of making a void between wirings, as described in the Japanese Unexamined Patent Publication No. 2-86146, which was described with reference to FIG. 5, because the shape of the overhang at a wiring end during interlayer insulation film, it is only possible to form a void when the wiring-to-wiring spacing is suitable for application of a formation of a void using the overhang.

Additionally, the size and the shape of the void is dependent in the above-noted method upon the wiring-to-wiring spacing and the cross-sectional shape of the wirings, leading to the problem of variations in the effect of reducing the capacitance.

Additionally, because the shape of the overhang of the insulation film is used, there is an increase in the step after the formation of the interlayer insulation film, making it difficult to achieve flattening in downstream processes, thereby hindering the achievement of smaller design rules.

(2) In the above-noted methods noted in the Japanese Unexamined Patent Publication Nos. 4-207055 and 5-21617, the method of making a void is that of performing selective etching from a small aperture in order to remove an insulation film that has a high etching rate and that is buried between wirings, it is necessary to add a photoresist process in order to form the aperture, this resulting in a major increase in the number of process steps.

Additionally, because the aperture is small in comparison with the size of the void, when using wet etching to form the void by etching, it is difficult to reliably remove the etching fluid, this leading to failures in downstream processes and to corrosion of wirings, which bring about a reduction in reliability.

Additionally, in order to establish mechanical strength in an LSI device with multilevel wiring, it is necessary to have wiring which does not have a void therebetween and to leave some posts standing, this leading to variation in the effect of reducing the capacitance.

In the manufacturing method of the past, the void it was not possible to perform good control the formation of the void height from a position that is above the upper surface of a wiring to a position that is below the lower surface of a wiring, so that unintended capacitance between the top and bottom of the void resulted in not being able to achieve a sufficient and accurate reduction in the capacitance.

In view of the above-described drawbacks in the prior art, an object of the present invention is to provide a semiconductor device which enables an arbitrary and highly accurate reduction the capacitance between adjacent wirings, thereby enabling the achievement of both a shrinking of the design rule and an increase in the speed of a semiconductor device, and to provide a method of manufacturing this semiconductor.

SUMMARY OF THE INVENTION

To achieve the above-noted object, in one aspect of the present invention, a semiconductor device according to the present invention is a semiconductor device comprising semiconductor elements formed on a surface of a substrate or a base insulation film, wirings connecting the elements and an interlayer insulation film, wherein the semiconductor device being provided with at least a longitudinal void portion at a position between adjacent two wirings through the interlayer insulation film, and further wherein one end of the void portion exceeding beyond a level corresponding to a top surface of the wirings, while the opposite end thereof exceeding below a level corresponding to a lower surface of the wirings.

And in a second aspect of the present invention, it is provided that a method of manufacturing a semiconductor device in which is formed elements and wirings, the method comprising steps of, forming an interlayer insulation film so as to cover all-over the wirings and areas between the wirings, using photoresist technology to perform simultaneously patterning operation so as to form a pattern for via hole apertures and to form a pattern for holes between the wirings, performing etching to form via holes using the photoresist as a mask, and simultaneously therewith, performing anisotropic etching to form apertures between the wirings, in the interlayer insulation film, selectively growing via hole burying metal only at the aperture that is to serve as a via hole, forming a second interlayer insulation film over the entire surface, so as to close off the top part only of the aperture in the area between wirings and of forming voids in the area between the wirings, and performing polishing and flattening the second interlayer insulation film until the via hole buried metal is exposed.

Further in a third aspect of the present invention it is also provided a method of manufacturing a semiconductor device in which is formed semiconductor elements and wirings, the method comprising steps of, forming an interlayer insulation film so as to cover over-all wirings and over areas between the wirings, using photoresist technology and dry etching technology to form apertures between the wirings, in the interlayer insulation film, forming a second interlayer insulation film over the entire surface of the first interlayer insulation film, so as to close off the top part only each one of the apertures, and forming a void in the areas between wirings, and performing polishing and flattening of the second interlayer insulation film so that the void is not exposed.

DETAILED DESCRIPTION OF THE PREFERRED EMBODIMENTS

Embodiments of present invention are described below, with reference being made to the relevant accompanying drawings.

Figure 2A:
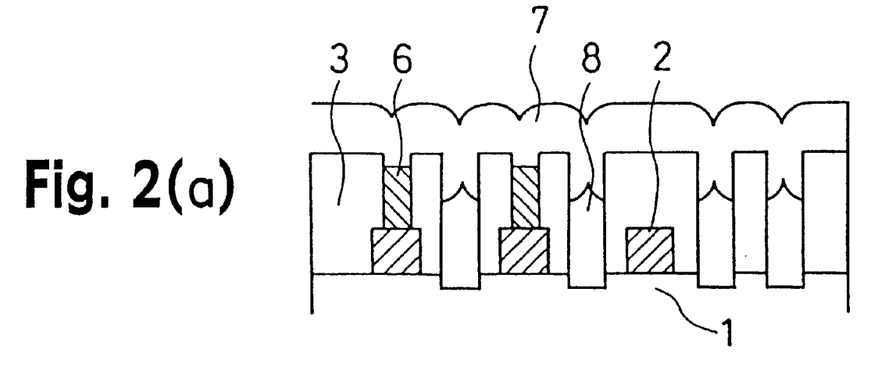
FIGS. 2(a)–2(c) are process cross-sectional views which illustrate the first embodiment of the present invention.
Figure 2B:
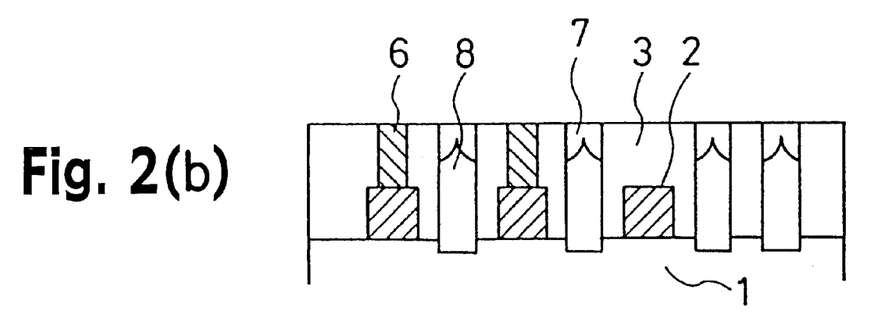
Figure 2C:
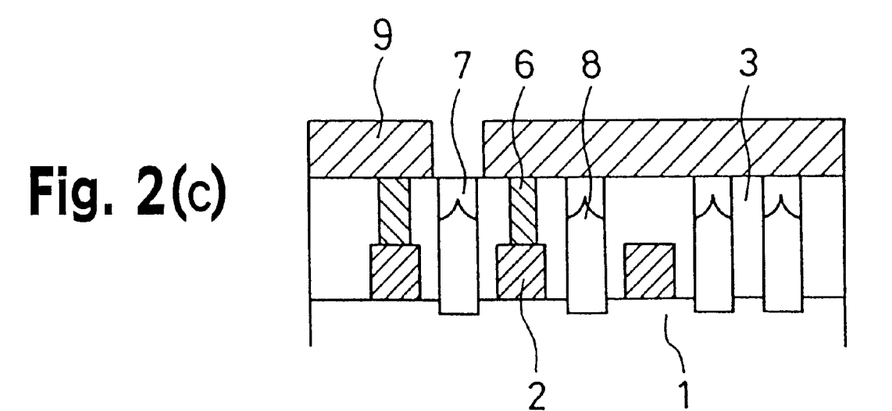

The preferred structure of a semiconductor device is shown in cross-sectional view in FIG. 2(c), in which a longitudinal void 8 that is formed in the insulation film 3 between the wirings 2 provides a lower capacitance between adjacent wirings, in comparison with a structure in which an insulation film is buried between wirings, thereby enabling an increase in the speed of the semiconductor device.

In the present invention, the longitudinal void 8 has a longitudinal axis arranged in a direction approximately perpendicular to a surface of the substrate or lower insulation film.

The cross-sectional configuration of the longitudinal void 8 is not particularly restricted to a specific one but it may be either one of a rectangular or circular configuration.

Because the longitudinal void 8 is formed by using photoresist technology and anisotropic etching technology, in comparison with a structure in which the overhang of an insulation film growth is used to form void by using a void-forming method or using anisotropic etching, there is less dependency on the wiring pattern and, because it is possible to form an arbitrary void at an arbitrary location, it is possible to obtain a uniform effect in reducing the capacitance.

The longitudinal void 8 has a height that extends from a position that is above the upper surface of the wiring 2 to a position that is below the lower surface thereof, also is has a side wall that is linear at an angle in the range from 80 degrees to 100 degrees with respect to the substrate.

Because this type of void 8 has a sufficient height to extend from above the upper surface of the wiring 2 to below the lower surface thereof, it enables a reduction in the capacitance between adjacent wirings, in consideration of the occurrence of capacitance components occurring between unintended locations.

Figure 1A:
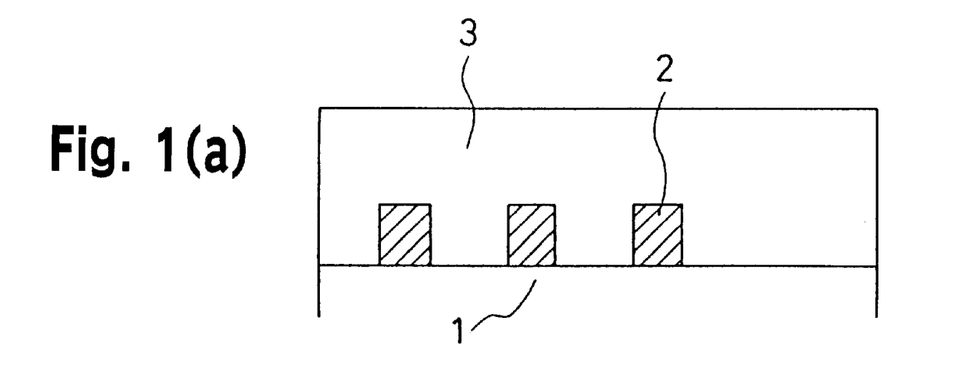
FIGS. 1(a)–1(c) are process cross-sectional views which illustrate the first embodiment of the present invention.
Figure 1B:
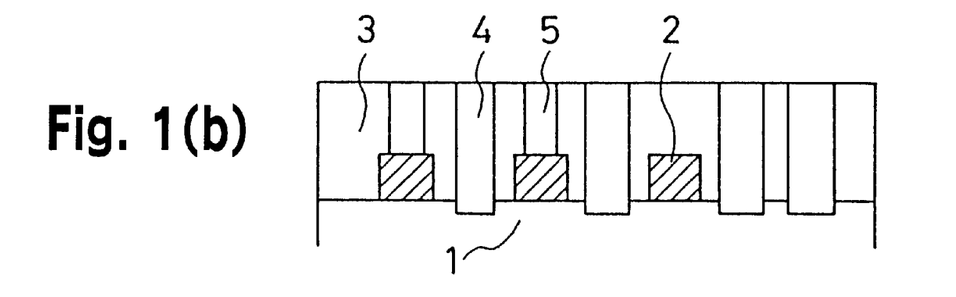
Figure 1C:
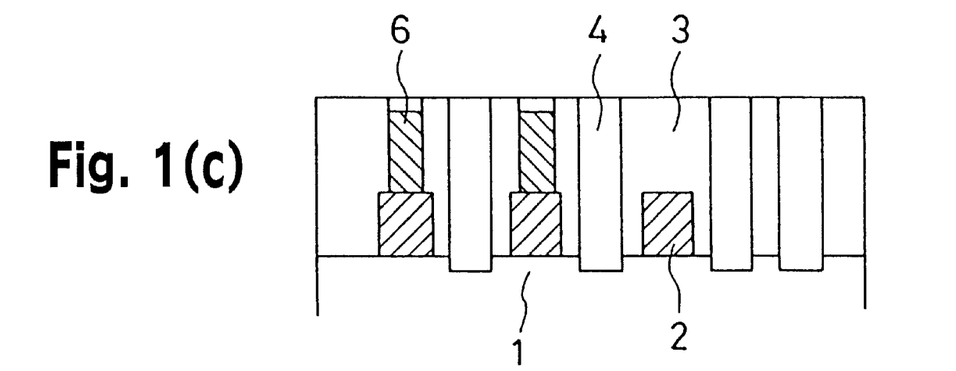

A preferred embodiment of a method of manufacturing a semiconductor device according to the present invention, as shown in the process cross-sectional views of FIGS. 1(a)–1(c) and FIGS. 2(a)–2(c), includes the steps of:

(a) forming a first interlayer insulation film 3 using photoresist technology and anisotropic etching technology;

(b) forming simultaneously via hole apertures 5 and apertures 4 forming between the adjacently arranged wirings (refer to FIG. 1(b));

(c) selectively growing a via hole buried metal 6 only at an aperture 5 that is to serve as a via hole (refer to FIG. 1(c));

(d) forming a second interlayer insulation film 7 over the entire surface, so as to close off the top part only of the above-noted aperture 4 in the area between wirings 2 and of forming a longitudinal void 8 in the above-noted area between wirings 2 (refer to FIG. 2(c)); and (e) performing polishing and flattening of the second interlayer insulation film 7 until the via hole buried metal 6 within the via hole is exposed.

By doing the above, an arbitrary void 8 can be formed which is not dependent on the wiring pattern, and it is possible to achieve a uniform reduction in the capacitance between adjacent wirings, and a highly accurate reduction of capacitance in a desired pattern.

FIGS. 3(a)–3(c) and FIGS. 4(a)–4(c) show a method of manufacturing a semiconductor device in which an aperture 4 and a via hole are formed between the wirings 2 separately, using photoresist technology and anisotropic etching technology, in which in the same manner it is possible to achieve a uniform reduction in the capacitance between adjacent wirings and a highly accurate reduction in the capacitance of a desired pattern.

The above-noted embodiment of the present invention will be described in more detail, with reference being made to relevant accompanying drawings.

FIGS. 1(a)–1(c) and FIGS. 2(a)–2(c) are process cross-sectional views which show the sequence of processes in a method of manufacturing according to the first embodiment of the present invention, and these drawings have been separated simply as a convenience in producing the drawings.

In FIGS. 1(a)–1(c) and FIGS. 2(a)–2(c), the reference numeral 1 denotes a substrate that has a semiconductor element or an interlayer insulation film that is disposed below wirings, this being made of, for example, an oxide film.

An alumina alloy wiring 2 (with a wiring thickness of 4500 Å (450 nm), a wiring width of 0.45 $\mu$m, and a wiring spacing of 0.4 $\mu$m) is patterned, and a first interlayer insulation film 3 (oxide film) is grown as a plasma oxide film or bias sputtered oxide film to a thickness of 1.5 $\mu$m so as to cover the wiring 2, after which CMP (chemical mechanical polishing) technology is used to perform polishing and flattening, thereby forming a film of a thickness of 800 nm above the wiring (refer to FIG. 1(a)).

Next, the usual photoresist technology and anisotropic etching technology are used to simultaneously form a via hole aperture 5 (0.4 μm square) and a n aperture 4 formed between the wirings (0.3 μm ).

If the spacing between wirings is large, a plurality of the apertures 4 can be formed (for example, if the wiring spacing is 0.9 μm, two apertures are formed with a width of 0.3 μm).

By establishing the amount of overetching for this etching as approximately 80%, the depth of the aperture 4 formed between the wirings is approximately 1400 nm, and an aperture is formed that is sufficiently deep between the wirings 2 (refer to FIG. 1(b)).

Next, the tungsten 6, for the purpose of burying a via hole, is selective grown using the CVD (chemical vapor deposition) method in the via hole aperture 5 only (for example, using $WF_6$ gas as the growth gas at a temperature of approximately 400° C., and reducing using either $H_2$ or $SiH_4$, tungsten will be grown only on top of the metal) (Refer to FIG. 1(c)).

Next, a second interlayer insulation film 7 (an oxide film formed as a plasma oxide film or a bias sputtered oxide film, with the RF power reduced to reduce burying, and under conditions that make it easy to close off the top part of the aperture 4), is formed over the entire surface until the only the top part of the aperture 4 is closed off.

The diameter of the aperture 4 formed between the wirings is 0.3 μm, the second interlayer insulation film is grown to a thickness of approximately 0.5 μm.

By doing this, a sealed void 8 is formed in the first interlayer insulation film 3 between the wirings 2.

Next, CMP wafer polishing technology is used to polish and flatten the second interlayer insulation film until the buried metal 6 is exposed (refer to FIG. 2(b)), after which the usual photoresist technology and etching technology are used to form the upper wiring 9 (refer to FIG. 2(c)).

FIGS. 3(a)–3(c) and FIGS. 4(a)–4(c) are process cross-sectional views which show the sequence of processes in a manufacturing method according to the second embodiment of the present invention.

Figure 3A:
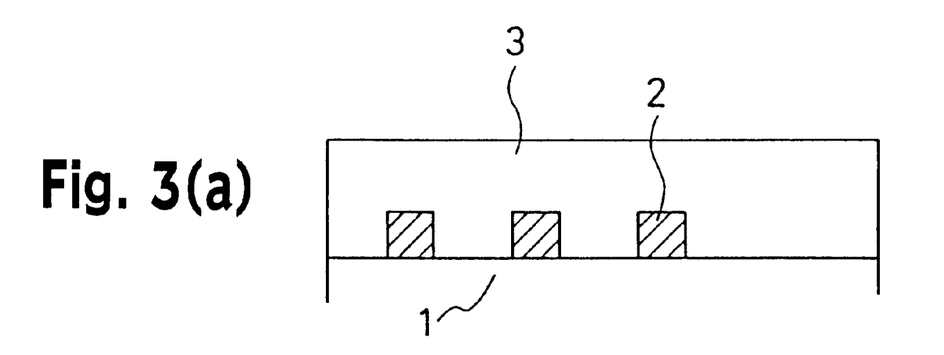
FIGS. 3(a)–3(c) are process cross-sectional views which illustrate the second embodiment of the present invention.

The process diagram of FIG. 3(a) is similar to FIG. 1(a), which shows the above-noted first embodiment.

Figure 3B:
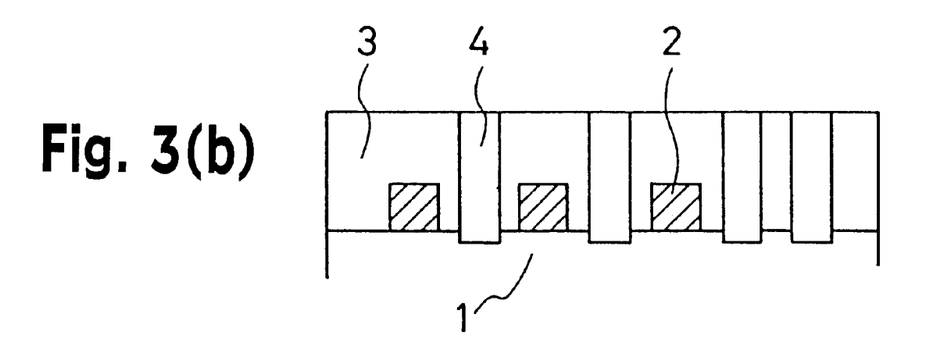
Figure 3C:
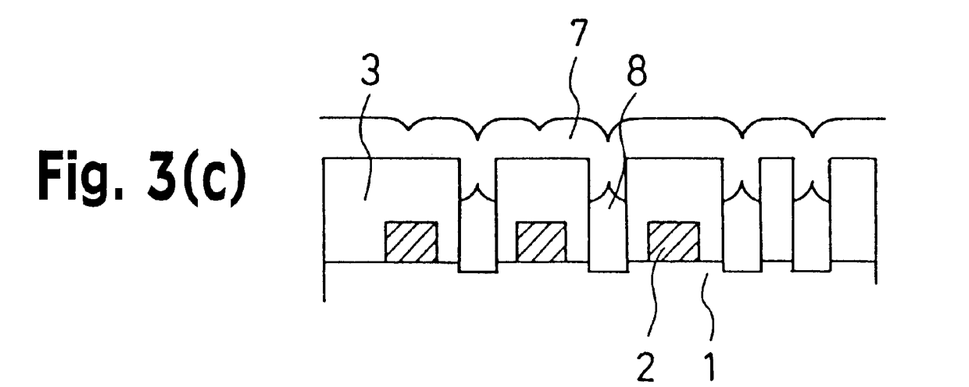

First, using the usual photoresist technology and etching technology, a n aperture 4 formed between the wirings (0.3 μm square) is formed (refer to FIG. 3(b)), after which a second interlayer insulation film 7 (an oxide film formed as a plasma oxide film or a bias sputtered oxide film, with the RF power reduced to reduce burying, and under conditions that make it easy to close off the top part of the aperture 4), is formed (refer to FIG. 3(c)) over the entire surface, to a thickness of 0.5 μm as in the first embodiment, until the only the top part of the wiring-to-wiring aperture 4 is closed off.

By doing this, a sealed void 8 is formed in the first interlayer insulation film 3 between the wirings 2.

Figure 4A:
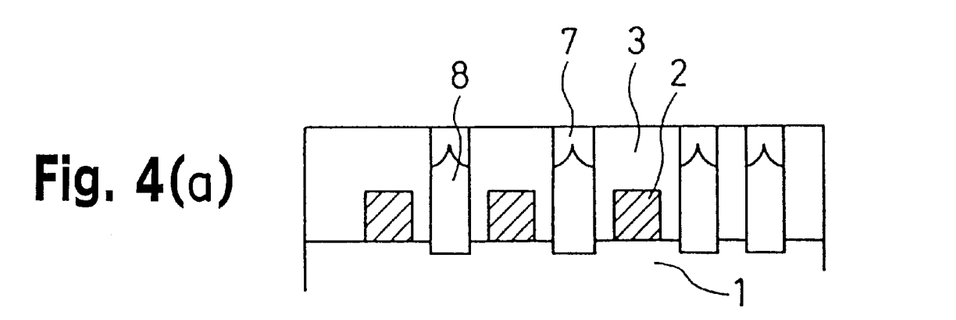
FIGS. 4(a)–4(c) are process cross-sectional views which illustrate the second embodiment of the present invention.

Next, CMP wafer polishing technology is used to polish and flatten the second interlayer insulation film, When doing this, the polishing is stopped so as not to expose the void 8 (refer to FIG. 4(a)).

Figure 4B:
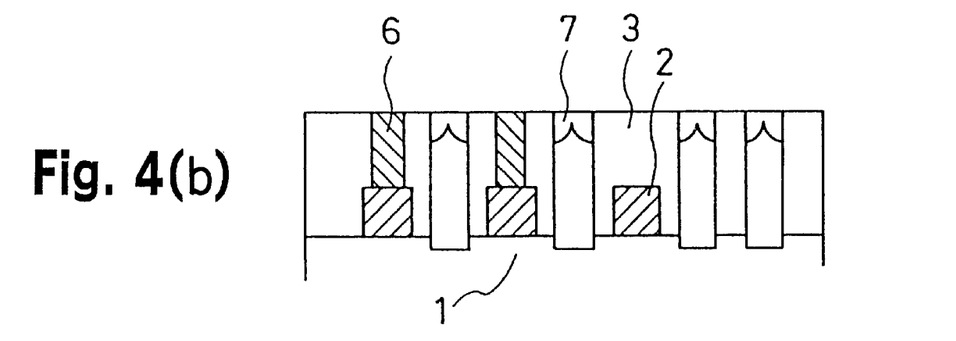
Figure 4C:
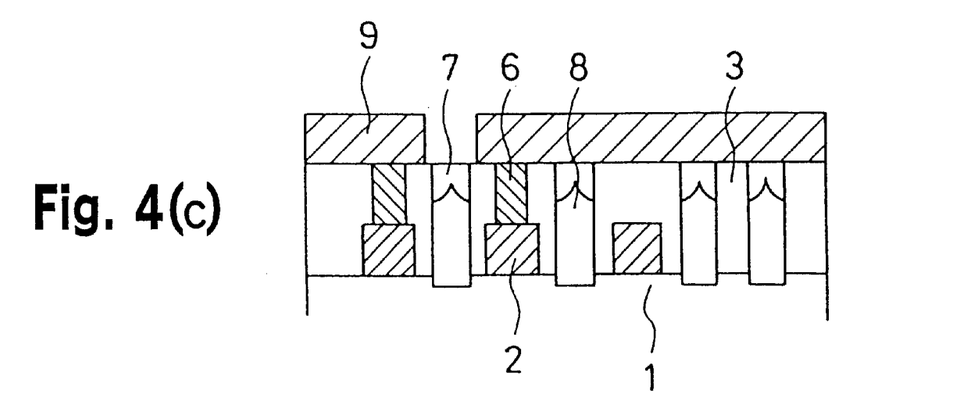

Next, the usual photoresist and etching technologies are used to form a via hole 6 (refer to FIG. 4(b)), after which the upper wiring 9 is formed (refer to FIG. 4(c)).

Whereas in the first embodiment the method was that of simultaneously patterning the via hole aperture and the aperture formed between the wirings, in the second embodiment although the separate patterning increasing the number of process steps, it facilitates growth in the case in which it is difficult to perform selective growth of tungsten.

It is also possible to reverse the formation sequence between the void and the via hole, so as to form the via hole and then form the aperture formed between the wirings (void).

In the above-described embodiment of the present invention, by using photoresist technology and anisotropic etching technology to form a void in an interlayer insulation film, there is no dependency on the wiring pattern, and it is possible to form an arbitrary number of voids at arbitrary locations, with a height from a position that is above the upper wiring surface to below the lower wiring surface, thereby enabling a uniform reduction in the capacitance between adjacent wirings, and also enabling a highly accurate reduction of the capacitance of a desired pattern.

As a result, it is possible to improve the speed of an integrated circuit and increase the degree of integration thereof.

Experimental results have verified that, compared with the case in which interwiring burying is done, when a void is formed between wiring there is a 25 to 20% reduction in the capacitance between adjacent wirings. Simulation results have verified that, for the case of a void height that extends 300 nm at the top and bottom of the wiring thickness of 4500 Å (450 nm), compared with the case in which the void height is the same as the wiring height, there is more than 50% decrease in capacitance.

As explained above, the semiconductor device of the present invention is further characterized in that the longitudinal axis of the longitudinal void portion is approximately perpendicular to a surface of the substrate or the base insulation film and further wherein the a side wall of the void portion, preferably being linear and at an angle in the range from 80 to 100 degrees with regard to a substrate of the semiconductor device.

In the present invention, the void portion may be formed in parallel with at least one of via holes.

More over, in the present invention, the semiconductor device is further characterized in that a plurality of the void portions are formed in one interval between the adjacently arranged wirings, and the capacitance between adjacent wirings can be adjusted either by changing the number of the voids arranged between adjacently arranged two wirings or by changing a cross-sectional area of the void formed therebetween.

And further, in the present invention, the semiconductor device is characterized in that the main portion of side surface of the void is made an interlayer insulation film made of a first material while at least one end portion of the void being sealed with an insulation film made of a second material different from the first material.

As described above in detail, in a semiconductor device and manufacturing method therefor according to the present invention by using photoresist technology and anisotropic etching technology to form a void in interlayer insulation film, there is no dependency upon the wiring pattern, and because it is possible to form an arbitrary number of voids at arbitrary locations, these having a height that extends from a position that is above the upper wiring surface to a position that is below the lower wiring surface, it is possible to achieve a uniform reduction in capacitance between wiring, and also to obtain a highly accurate reduction in the capacitance of a desired pattern.

As a result, it is possible to improve both the speed and the level of integration of the integration circuit.

Japanese Patent Application No. 9-157854 is incorporated herein by reference.

What is claimed is:

1. A method of manufacturing a semiconductor device in which are formed elements and wirings, said method comprising steps of:

(a) forming an interlayer insulation film so as to cover all of said wirings and areas between said wirings;

(b) using photoresist technology to perform simultaneous patterning operation so as to form a photoresist pattern for via holes and for apertures between said wirings;

(c) performing etching to form said via holes using said photoresist pattern as a mask, and simultaneously therewith, performing anisotropic etching to form said apertures between said wirings, in said interlayer insulation film, bottom ends of said apertures being lower in level than bottom surfaces of said wirings;

(d) selectively growing via hole burying material only at the via holes;

(e) forming a second interlayer insulation film over the entire surface to close off the top part only of said apertures in the area between said wirings, so as to form voids in said area between said wirings, bottom ends of said voids being lower in level than bottom surfaces of said wiring, and top ends of said voids being higher in level than top surfaces of said wirings; and (f) polishing and flattening said second interlayer insulation film until said via hole buried material is exposed.

* * * * *